(12) United States Patent
Kwok et al.

(10) Patent No.: US 7,998,537 B2
(45) Date of Patent: Aug. 16, 2011

(54) METHOD FOR SELECTIVELY REMOVING HYDROGEN FROM MOLECULES

(75) Inventors: Raymond W. M. Kwok, Hong Kong (CN); Woon Ming Lau, Hong Kong (CN)

(73) Assignee: The Chinese University of Hong Kong, Shatin, N.T., Hong Kong SAR (CN)

( * ) Notice: Subject to any disclaimer, the term of this patent is extended or adjusted under 35 U.S.C. 154(b) by 155 days.

(21) Appl. No.: 10/374,550

(22) Filed: Feb. 25, 2003

(65) Prior Publication Data

US 2003/0165635 A1 Sep. 4, 2003

Related U.S. Application Data

(60) Provisional application No. 60/361,160, filed on Mar. 1, 2002.

(51) Int. Cl.
*C23C 16/48* (2006.01)
*C23C 14/46* (2006.01)
*B05D 3/06* (2006.01)
*C23C 14/48* (2006.01)

(52) U.S. Cl. ......... 427/534; 427/533; 427/525; 427/524

(58) Field of Classification Search .................. 427/488, 427/489, 490, 491, 525, 527, 528, 533, 534, 427/535, 536, 562, 563, 569, 571, 574, 575, 427/578, 579
See application file for complete search history.

(56) References Cited

U.S. PATENT DOCUMENTS

| | | | | |
|---|---|---|---|---|
| 4,401,054 A | * | 8/1983 | Matsuo et al. | 118/723 MR |
| 4,950,543 A | * | 8/1990 | Winter et al. | 428/408 |
| 4,976,818 A | * | 12/1990 | Hashimoto et al. | 438/703 |
| 5,270,029 A | * | 12/1993 | Yamazaki | 423/446 |
| 5,277,939 A | * | 1/1994 | Yamazaki | 427/571 |
| 5,279,866 A | * | 1/1994 | Bourget et al. | 427/575 |
| 5,512,330 A | * | 4/1996 | Dearnaley | 427/525 |
| 5,677,372 A | | 10/1997 | Yamamoto et al. | |
| 5,691,009 A | * | 11/1997 | Sandhu | 427/534 |
| 5,789,040 A | * | 8/1998 | Martinu et al. | 427/575 |
| 5,888,593 A | * | 3/1999 | Petrmichl et al. | 427/563 |
| 5,939,149 A | | 8/1999 | Jang et al. | |
| 5,945,153 A | * | 8/1999 | Dearnaley | 427/2.12 |
| 6,077,569 A | * | 6/2000 | Knapp et al. | 427/534 |
| 6,156,394 A | * | 12/2000 | Schultz Yamasaki et al. | 427/536 |
| 6,169,127 B1 | * | 1/2001 | Lohmann et al. | 523/106 |
| 6,200,626 B1 | * | 3/2001 | Grobe et al. | 427/2.24 |
| 6,217,171 B1 | * | 4/2001 | Auten et al. | 351/160 H |
| 6,436,481 B1 | * | 8/2002 | Chabrecek et al. | 427/488 |
| 6,472,299 B2 | * | 10/2002 | Hiraoka et al. | 438/509 |
| 6,727,334 B2 | * | 4/2004 | Nishiwaki et al. | 526/240 |
| 6,821,905 B2 | * | 11/2004 | Pan et al. | 438/706 |
| 6,902,774 B2 | * | 6/2005 | Nicolussi | 427/535 |
| 6,911,767 B2 | * | 6/2005 | Takai | 313/311 |
| 6,921,722 B2 | * | 7/2005 | Ogure et al. | 438/708 |
| 6,951,787 B2 | * | 10/2005 | Allman et al. | 438/239 |
| 2002/0102415 A1 | * | 8/2002 | Valint, Jr. et al. | 428/447 |
| 2003/0157765 A1 | * | 8/2003 | Allman et al. | 438/239 |
| 2003/0205823 A1 | * | 11/2003 | Leu et al. | 257/774 |
| 2004/0018320 A1 | * | 1/2004 | Nicolussi | 427/535 |

FOREIGN PATENT DOCUMENTS

| | | | | |
|---|---|---|---|---|
| JP | 57175720 A | | 10/1982 | |
| JP | 63-20073 | * | 1/1988 | .................. 427/536 |
| JP | 8064531 A | | 3/1996 | |

OTHER PUBLICATIONS

Translation of JP 63-020073 to Shigeki Kato et al. published Jan. 27, 1988.*
Weast, Robert C., editor, Handbook of Chemistry and Physics, 56 edition, CRC Press, Inc., Cleveland, Ohio, 1975 (no month), excerpt p. F-224 to F-225.*
Chiu, et al., "Charge Transfer and Structured Vibrational Distributions in $H^+ + CH_4$ Low-energy Collisions," *J. Chem. Phys.*, vol. 88, No. 11. American Institute of Physics. pp. 6814-6830, (Jun. 1, 1988).
Houssiau, et al., "Characterization of the Surface Structure of $CH_3$ and $CF_3$ Terminated n-alkanethiol Monolayers Self Assembled on Au(111)." *Journal of Chemical Physics*, vol. 109, No. 20, American Institute of Physics, pp. 9134-9147, (Nov. 22, 1998).
Masson, et al. "Application of Direct Recoil Spectrometry to Determination of the Saturation Coverage of Ethylene on Pt(111)," *Surface Science*, vol. 221, North-Holland Amsterdam, Elsevier Science Publishers B.V (North-Holland Physics Publishing Division), pp. 299-316 (1989).
Rabalais, "Direct Recoil Spectrometry," *CRC Critical Reviews in Solid State and Materials Sciences*, vol. 14, Issue 4, pp. 319-376, (1988).
Uehara, et al., "Calculations of Electronic Stopping Cross Sections for Low-Energy Protons in Water," *Radiation Physics and Chemistry*, vol. 59, Elsevier Science Ltd., pp. 1-11, (2000).
Zavitsas, "Energy Barriers to Chemical Reactions. Why, How, and How Much? Non-Arrhenius Behavior in Hydrogen Abstractions by Radicals," *J. Am. Chem. Soc.*, vol. 120, No. 26, American Chemical Society, pp. 6578-6586, (1998).
Zheng, et al.; "Ultrathin Polymer Film Formation by Collision-induced Cross-Linking of Adsorbed Organic Molecules with Hyperthermal Protons;" *J. Am. Chem. Soc.*; Sep. 10, 2004; pp. 12338-12342; vol. 126; American Chemical Society.
Kitchen et al. "Photodissociation of Acrylic Acid at 193 nm." J. Phys. Chem. A 1997, 101, 6603-6610.
Hong et al. "An Investigation of Plasma-Polymer Interactions by Mass Spectrometry." Plasmas and Polymers, vol. 7, No. 3, pp. 245-260, Sep. 2002.
Klemberg-Sapieha et al. "Tailoring the adhesion of optical films on polymethyl-methacrylate by plasma-induced surface stabilization." Thin Solid Films, 476 (2005) 101-107.
Hoffmann, Norbert. "Photochemical Reactions as Key Steps in Organic Synthesis." Chem. Rev. 2008, 108, 1052-1103.
Kobayashi et al. "Effects of Reaction Conditions on the Plasma Polymerization of Ethylene." J. Macromol. Sic.-Chem., A8(2), pp. 373-391 (1974).
Evidence of C-C cleavage due to electron impact on propane ($CH_3CH_2CH_3$). NIST Chemistry WebBook (http://webbook.nist.gov/chemistry).

* cited by examiner

*Primary Examiner* — Marianne L Padgett
(74) *Attorney, Agent, or Firm* — Dowell & Dowell, PC; Lynn C. Schumacher

(57) ABSTRACT

Methods for removing hydrogen from molecules are disclosed. In one embodiment, hydrogen-containing molecules are deposited on a solid substrate and are bombarded with hydrogen projectile particles. The particles may have energies of 5-100 eV, or more preferably 10-50 eV. The hydrogen projectile particles remove hydrogen atoms from the deposited molecules while they are on the substrate, without removing other atoms from the molecules. Dangling bonds are created by the loss of hydrogen and can be used to cross-link the molecules. The resulting product can be a nanometer-thick dense film.

22 Claims, No Drawings

METHOD FOR SELECTIVELY REMOVING HYDROGEN FROM MOLECULES

CROSS REFERENCE TO RELATED APPLICATIONS

This application is a non-provisional patent application of and claims the benefit of U.S. Provisional Patent Application Ser. No. 60/361,160, filed Mar. 1, 2002, which is herein incorporated by reference in its entirety for all purposes.

FIELD OF THE INVENTION

Embodiments of the invention relate to the field of materials synthesis.

BACKGROUND OF THE INVENTION

Rupturing or removing hydrogen atoms from a hydrogen-containing molecule is commonly referred to as hydrogen abstraction in chemistry. A number of reactants can be used in hydrogen abstraction. Common reactants include hydrogen atoms, halogen atoms, hydroxyl radicals, and other radical species. Although the reactants are reactive, an activation energy is still commonly required for hydrogen abstraction and some reactions thus require adequate thermal energy (A.A. Zavitsas, Journal of American Chemical Society 120 (1998)6578-6586). Worst of all, most of these reactants, in addition to removing hydrogen atoms, also react with other chemical functional groups in the molecule and/or may remove non-hydrogen atoms. Further, some of these reactive species are toxic, environmentally harmful, or costly. Novel and economical reaction routes for selective hydrogen abstraction are thus desirable.

In the research and development of new reaction routes, scientists have discovered that the kinetic energy of a reactant can be an important reaction attribute. It can be used to drive a chemical reaction which otherwise relies totally on chemical potentials and thermal energy. The best fundamental evidence can be found in most scientific articles on molecular beam research in the literature (see for example, M. A. D. Fluendy and K. P. Lawley, "Chemical applications of molecular beam scattering", Chapman and Hall, 1973). In this research, a beam of atoms or molecules having a specific kinetic energy and internal energy is directed to a target. The energy exchange and resultant chemical reactions are examined.

Normally, kinetic energy is added to the atoms or molecules when they are adiabatically expanded with an inert gas through a small nozzle. The velocity of the atoms or molecules can increase to supersonic speed. However, this technique is sometimes not suitable for light species, since the kinetic energy of a light atom like hydrogen traveling at supersonic speed is still much less than 0.1 eV.

The kinetic energies of the atoms or molecules can also be increased by ionizing them and then accelerating them using an electrostatic ion acceleration process. These accelerated ions can be used to bombard a target in an "ion bombardment" process. Many industrial processes use ion bombardment to reduce the reliance of synthetic reactions on thermal energy and to promote reactions via non-thermal equilibrium pathways (see for example, O. Auciello and R. Kelly, "Ion bombardment modification of surfaces", Elsevier Science, 1984).

Ion bombardment processes have also been used in surface composition measurements, specifically in "direct recoiling" processes. Direct recoiling refers to the collision event in which a projectile, usually an accelerated ion, hits an atom on a solid surface and transfers some kinetic energy to the atom, causing the atom to depart from the surface directly. Since the late 70's, studies of direct recoiling have been developed into a practical surface science technique for the detection of light elements adsorbed on a solid surface.

In a typical direct recoiling process, inert gas ions at a few keV are used to recoil light atoms to an analysis detector (see for example, J. W. Rabalais, "Direct recoil spectrometry", CRC Critical Reviews in Solid State and Materials Science 14(1988)319-376). Direct recoil spectrometry has been recognized as one of the few surface science techniques capable of detecting hydrogen on a solid surface containing hydrogen. For example, Rabalais and coworkers used 4 keV $Ar^+$ to recoil hydrogen from $CH_3(CH_2)_{16}SH$ adsorbed on gold, $CH_3(CH_2)_{15}SH$ adsorbed on gold, and $CF_3(CH_2)_{15}SH$ adsorbed on gold (J. W. Rabalais and coworkers, Journal of Chemical Physics 109(1998)9134-9147), and 4 keV $K^+$ to recoil hydrogen from $C_2H_4$ adsorbed on platinum (J. W. Rabalais, Surface Science 221(1989)299-316), for the detection of hydrogen and the measurement of other surface science data. However, when bombarding hydrocarbon molecules with ions under such conditions, signals showing the rupturing of carbon for all molecules and fluorine for $CF_3(CH_2)_{15}SH$ were detected. These signals were as intense as those corresponding to recoiling hydrogen. Hence, the ion bombardment processes described by Rabalais et al. showed that hydrogen, carbon and fluorine are all removed. The processes described by Rabalais et al. cannot be used to selectively rupture hydrogen from a molecule.

SUMMARY OF THE INVENTION

Embodiments of the invention are directed to methods for selectively removing hydrogen atoms from molecules while the molecules are on the surface of a substrate or are constituents of a substrate.

One embodiment of the invention comprises depositing molecules comprising hydrogen atoms on the surface of a substrate. In one exemplary deposition process, the molecules are adsorbed onto the surface of the substrate. Hydrogen projectile particles are then used to bombard the molecules. The bombardment removes at least some of the hydrogen atoms from the molecules, without removing non-hydrogen atoms from the molecules. For example, the bombardment can remove hydrogen atoms from an alkane without removing carbon atoms from the alkane. After removing hydrogen atoms, the hydrogen-deficient and activated molecules may be further processed (e.g., reacted) on the substrate if desired. For example, the hydrogen-deficient and activated molecules may be cross-linked while on the substrate to form a dense film of material on the substrate. As used herein, "hydrogen-deficient and activated molecules" refer to molecules that have active reaction sites and have fewer hydrogen atoms than the molecules have prior to bombardment. In some embodiments, the hydrogen-deficient and activated molecules may still have hydrogen atoms.

Thus, in one aspect of the present invention, there is provided a method comprising: (a) depositing hydrocarbon molecules comprising hydrogen atoms and other atoms on a substrate to form a hydrocarbon layer; (b) bombarding the deposited molecules with a beam of only ionized hydrogen projectile particles which have kinetic energies between about 5 eV and about 100 eV; and (c) preferentially breaking C—H bonds in the molecules in the hydrocarbon layer by collision induced breakage of the C—H bonds using the hydrogen projectile particles without without removing a significant number of the other atoms from the molecule Another embodiment of the invention is directed to a method comprising: (a) bombarding a layer of molecules comprising hydrogen and non-hydrogen atoms on a substrate with hydrogen projectile particles; and (b) removing the hydrogen atoms from the bombarded molecule without removing the non-hydrogen atoms from the molecule.

Another embodiment of the invention is directed to a composite article comprising: (a) a substrate; and (b) a layer comprising hydrogen-deficient and activated molecules on the substrate, wherein each hydrogen-deficient and activated molecule comprises dangling bonds.

Another embodiment of the invention is directed to a method comprising: a) providing a substrate and a hydrocarbon layer on a surface of the substrate; b) bombarding the hydrocarbon layer with a beam of only ionized hydrogen projectile particles which have kinetic energies between about 5 eV and 100 eV; c) preferentially breaking C—H bonds in the molecules in the hydrocarbon layer by collision induced breakage of the C—H bonds using the hydrogen projectile particles to form active reaction sites without removing a significant number of the other atoms from the molecule; and d) depositing a substance on the hydrocarbon layer and anchoring the substance to the hydrocarbon layer through the active reaction sites.

Other embodiments of the invention are directed to products made by the above described methods and other methods.

These and other embodiments of the invention are described in further detail below. The description of the specific embodiments is for purposes of illustration and is not intended to limit the invention.

The potential number of applications for embodiments of the invention is not limited. For example, embodiments of the invention can be used to fabricate electronic devices, photonic devices, micro-mechanical devices, and medical devices. They can also be used in biotechnology applications.

DETAILED DESCRIPTION

Molecules containing hydrogen atoms are abundant. Hydrocarbons as well as many inorganic compounds contain hydrogen atoms. When a hydrogen atom is ruptured (i.e., removed) from a molecule, the reactivity of the molecule increases since an active reaction site is formed where the removed hydrogen was present. The formed active reaction site may be a dangling bond that can form a chemical bond with another atom (e.g., on another molecule). If the hydrogen-deficient and activated molecule is on the surface of a solid substrate, for example, it can cross-link with other molecules on the solid substrate and/or can bind to the substrate through the formed active reaction site. A stable network of molecules can thus be formed on the substrate after cross-linking. Also, if the hydrogen atoms are selectively ruptured from a molecule, the backbone of the molecule and any specific chemical functionalities on the backbone can be preserved. Embodiments of the invention can therefore produce a layer with a stable molecular network having molecules with specific, predetermined chemical functionalities.

Binary collision theory can be used to explain why hydrogen projectile particles can selectively remove hydrogen atoms from molecules. Rabalais and coworkers showed that for a 4 keV $Ar^+$ bombardment process, the phenomena of hydrogen recoil can be approximated quite accurately by a simple binary collision between argon and hydrogen. In the framework of a simple binary collision, the maximum energy transfer from a projectile of mass $M_o$ to a stationary target atom of mass $M_t$ is $4M_oM_t/(M_o+M_t)^2$. The present inventors chose hydrogen as the preferred projectile particle so that the maximum energy transfer from the projectile particle to a hydrogen target atom can be as high as 100%. For example, in the binary collision framework, for a molecule containing both hydrogen and carbon atoms, a hydrogen projectile can transfer up to 100% of its kinetic energy to a hydrogen atom of the molecule, but only up to 28.4% of its kinetic energy to a carbon atom in the molecule. Illustratively, in a hydrocarbon molecule, the typical bond energy for a single bond like C—H and C—C is about 4 eV. A hydrogen projectile particle with a kinetic energy of 10 eV can rupture a hydrogen atom from the adsorbed hydrocarbon molecule, but it generally cannot rupture a carbon atom from the molecule. This is because the carbon atom, when struck by the 10 eV hydrogen projectile particle, can at the most get 2.8 eV in kinetic energy. This is smaller than the bond energy of the carbon atom to the molecule. Similarly, the maximum energy transfer will be 2.5 eV for a nitrogen atom, 2.2 eV for an oxygen atom, 1.9 eV for a fluorine atom, 1.2 eV for a sulfur atom, and 1 eV for a chlorine atom, which are all less than the respective bond energies of these atoms to carbon. In fact, to rupture a carbon atom out from a simple linear alkyl carbon chain adsorbed on a solid surface, one needs to break one C—C bond for the carbon atoms at the two ends of the chain and two C—C bonds for the majority carbon atoms. With the assumption of a binary collision and a C—C bond energy of 4 eV, a hydrogen projectile particle with less than 14 eV cannot rupture any carbon atoms from the chain, and for that with less than 28 eV cannot rupture any carbon atoms except those two which terminate the chain.

The projectile particles used in embodiments of the invention have kinetic energies high enough to rupture hydrogen atoms from a hydrogen containing molecule on a solid surface. While the kinetic energies are high enough to remove hydrogen atoms, the kinetic energies of the projectile particles are not high enough to cause a significant amount of undesired bond breakage in the molecule. For example, a hydrogen may be removed from an alkane by breaking a C—H bond. However, the C—C bonds in the alkane are not broken by the projectile particles so that carbon is not removed from the molecule. Embodiments of the invention are effective because the collision cross-section between a hydrogen projectile particle with a kinetic energy of 4 to 100 eV and a stationary hydrogen atom is within a few $Å^2$ (S. Uehara et al., Radia. Phys. Chem. 59, (2000)1-11), which is close to the physical cross-sectional area of the hydrogen atom itself. As such, the collision probability is extremely high.

The simple binary collision framework described above can be used as a rough guide for predicting bond breakage caused by the bombardment, for example, of an adsorbed molecule with a hydrogen projectile particle having a kinetic energy between about 5 and about 100 eV. The applicability of the simple binary collision framework to describe the kinematics of projectile particles colliding with atoms of a solid has indeed been confirmed for a projectile energy range as low as 20 eV with $Ne^+$ as the projectile particle and copper as the solid being bombarded. However, no accurate kinematics data for $H^+$ colliding with a solid in a similar energy range have been published.

It is noted that J. P. Toennies and coworkers (Journal of Chemical Physics 88(1988)6814-6830) have shown that when an $H^+$ projectile particle with energy in the range of 10-30 eV hits a free, gaseous $CH_4$ molecule, the projectile particle can interact with the entire molecule. The projectile particle transfers some energy to the molecule to vibrationally excite it. Furthermore, the $H^+$ can also transfer its charge to the CH$_4$ molecule and destabilize the molecule. Their data show that while H$^+$ hitting CH$_4$ at 9.8 eV with a small scattering angle, a collision geometry which leads to inefficient energy transfer, causes only vibrational excitation but not any hydrogen rupturing from CH$_4$, increasing the collision energy to 20 eV can cause the bond breakage under the same collision geometry.

In contrast to the work done by Toennies et al., in embodiments of the invention, hydrogen atoms are removed from hydrogen containing molecules on or as constituents of the surface of a substrate without breaking other non-hydrogen bonds in the molecules. Removing hydrogen atoms from adsorbed molecules on a substrate, for practical applications, is typically more complex than removing hydrogen from free CH$_4$ molecules. For instance, when removing atoms coupled to a substrate, the substrate surface also provides a sink for both the electrical charge carried by charged incident projectiles and some incident energy. When molecules are in a gaseous phase as in Toennies et al., process variations caused by the presence of the substrate need not be taken into account. Hence, the inelastic processes and charge transfer processes described by Toennies and coworkers are different from embodiments of the invention, which selectively remove hydrogen atoms from molecules that are on the surface of a substrate or are constituents of the surface.

In one method according to an embodiment of the invention, the method comprises depositing hydrogen containing molecules comprising hydrogen atoms on a surface of a substrate. The hydrogen containing molecules may be adsorbed on the surface of the substrate. Then, the deposited hydrogen containing molecules are bombarded with projectile particles such as hydrogen projectile particles. The bombardment removes some hydrogen atoms from the deposited molecules to form hydrogen-deficient and activated molecules.

The hydrogen-deficient and activated molecules may also have dangling bonds where the hydrogen atoms were previously present. A dangling bond refers to an unpaired electron. An atom with a dangling bond is reactive and capable of reacting with other molecules, other atoms, or with the surface of a substrate. A dangling bond can also be amended by abstracting a neighboring hydrogen atom in the same molecule or from another molecule. In this process, a new dangling bond is created and the net result is a movement of the dangling bond. In a molecule, if an atom next to another atom having a dangling bond has an unsaturated bond with a third atom, the dangling bond can also be amended by abstracting one of the two pi electrons of the unsaturated bond. In this process, a new dangling bond is created at the third atom and the net result is a movement of the dangling bond by the distance across three adjacent atoms. More importantly, a dangling bond can be amended by another dangling bond, which can lead to the formation of an intermolecular cross-linkage. Intermolecular cross-links can also be formed when a dangling bond of one molecule is adjacent to an unsaturated bond of another molecule such that the original dangling bond is amended by one pi electron of the unsaturated bond for the formation of an intermolecular bond. In this process, a new dangling bond is created in the molecule having the unsaturated bond. Cross-linking can transform loosely and physically bounded molecules into a thin film of dense material. The movement of dangling bonds extends the thickness of the film which can be produced by embodiments of the invention beyond the penetration depth of the hydrogen projectile particles in a solid. In some embodiments, the formed thin film may be gas-impermeable.

Illustratively, a layer of polyvinylidene fluoride (PVDF) can be deposited on a substrate. Hydrogen atoms can then bombard the layer of PVDF. The bombardment removes some hydrogen atoms from the PVDF molecules, but not fluorine or carbon atoms. Active reaction sites form where the hydrogen atoms were previously present. The hydrogen-deficient and activated PVDF molecules can then be cross-linked at the active reaction sites to form a layer with a network of carbon chains with fluorine atoms, but with fewer hydrogen atoms than were originally present in the PVDF molecules. The resulting layer can be dense and thin.

In embodiments of the invention, any suitable deposition process may be used to deposit hydrogen-containing molecules on a substrate. The deposition process can be liquid-based or vapor-based. Exemplary liquid deposition processes include gas dosing, roller coating, dip coating, spray coating, jet-printing, screen-printing, spin coating, mechanical rolling, lamination, etc. Exemplary vapor deposition processes include evaporation, PVD (physical vapor deposition), CVD (chemical vapor deposition), etc. In some embodiments, the hydrogen containing molecule may be adsorbed (e.g., chemisorbed or physisorbed) on the solid surface. The skilled artisan may select the exact processing conditions.

The deposited layer of hydrogen containing molecules may have any suitable thickness. For example, in some embodiments, the deposited layer may be an atomic monolayer of molecules. In other embodiments, the deposited layer may be more than 100 nanometers thick. The combination of dangling bond formation by bombarding the layer with hydrogen projectile particles and dangling bond movement in the layer can cross-link molecules in such a layer thickness.

The molecules that are to be bombarded comprise hydrogen atoms. Examples of such molecules include hydrocarbons which can be saturated or unsaturated, with or without other chemical functionalities. Further, the molecules can also be any polymers comprising hydrogen atoms. In addition, the molecules can be those containing silicon and hydrogen (e.g., silane units). These molecules can be saturated or unsaturated. The presence of unsaturated bonds in a molecule enhances movement of dangling bonds.

The molecules that are to be bombarded may comprise any suitable number of functional groups or combination of functional groups. As will be explained in further detail below, these functional groups may remain in the molecules after bombarding. The resulting layer may comprise specific functional groups or combinations of functional groups, and may further be cross-linked. Examples of functional groups that may be present alone or in combination in the molecules, include thoils, halides, amines, esters, carboxylic acids, carbonyls, hydroxyls, and silanes.

In applications where a special functional group which contains hydrogen is to be preserved (e.g., a —COOH group), the concentration of this functional group relative to the concentration of C—H units in the molecule to be bombarded can be adjusted to minimize the damage of the functional group. For example, if there is one special functional group comprising hydrogen (e.g., COOH) per 20 C—H units and among every 20 C—H units, only 2 C—H bonds need to be ruptured for cross-linking to occur. The chance of damaging the special function group (e.g., removing an H atom from COOH) in the bombardment and subsequent cross-linking process is 10%.

The substrate upon which the molecules are deposited may be in any suitable form. The substrate may be porous or non-porous, and planar or non-planar. For example, the substrate may be in the form of a wafer, plate, tube, curved body, etc., In some embodiments, the substrate may further include one or more sublayers (e.g., a coated body).

The substrate may also include any suitable material. For example, the substrate may comprise one or more of a metal, polymeric material, inorganic material (e.g., glass), ceramic, composite, etc. Additionally, the substrate may comprise a conductor, insulator, or semiconductor. For instance, the substrate may include a metal such as copper, aluminum, or a noble metal. The substrate could also include a semiconductor such as silicon (e.g., a silicon wafer) or gallium arsenide.

If desired, the substrate may be pre-cleaned or pre-processed prior to depositing the molecules to be bombarded. Pre-cleaning or pre-processing the substrate can result, for example, in better adherance between the substrate and the layer that is finally formed on the substrate. Exemplary pre-cleaning steps can include washing the substrate in a liquid bath. An exemplary pre-preprocessing step may comprise functionalizing the surface of the substrate with pre-determined chemical functional groups.

Any suitable bombardment process may be used in embodiments of the invention. In embodiments of the invention, hydrogen projectile particles are used in the bombardment process. Examples of hydrogen projectile particles can include ionized atoms or molecules of hydrogen or its isotopes, and can include energetic neutral atoms or molecules of hydrogen or its isotopes. In embodiments of the invention, the kinetic energies of the projectile particles can be less than about 1000 eV. For example, in some embodiments, the kinetic energies of the projectile particles are between about 5 eV to about 1000 eV (e.g., between about 5 and about 100 eV), preferably between about 10 eV to about 50 eV. In other embodiments, the kinetic energies of the projectile particles are between about 10 eV and about 28 eV.

In a typical embodiment, the substrate with the hydrogen-containing molecules on it is placed in a chamber in a bombardment apparatus. Hydrogen projectiles are created upstream of the substrate and bombard the hydrogen-containing molecules. After bombardment, the substrate is removed from the chamber.

The number of ions or density of ions used to bombard the hydrogen containing molecules can vary according to the particular molecules that are to be bombarded. For example, in some embodiments, 20 or more hydrogen projectile particles per bombarded molecule may be sufficient to remove an adequate amount of the hydrogen atoms from the molecule to form the desired product. Also, in some embodiments, the projectile particle density may be greater than $1 \times 10^{15}$ particles/cm$^2$.

The hydrogen projectile particles can be generated using any suitable apparatus or process. For example, high-speed projectile particles can be formed using an adiabatic expansion process (described in the Background section above). Also, as described above, in some embodiments, the velocities of the particles can be increased by ionizing them and then accelerating them in an electrostatic ionization process. In this regard, the ionized particles may form an ion beam. Generating ionized projectile particles and ion beams are well known. An exemplary apparatus that can be used to generate a beam of ionized projectile particles may be an electron cyclotron resonance (ECR) plasma reactor. Electron cyclotron resonance plasma reactors are widely used for reactive ion etching in the semiconductor industry because they can generate intense beams of energetic particles. Such reactors are commercially available.

The bombardment of the molecules removes at least some hydrogen atoms from the molecules. In a hydrocarbon molecule, hydrogen atoms are removed by breaking C—H bonds in the molecule. Most or all non-hydrogen atoms remain in the molecules even though some or all of the hydrogen atoms are removed from them. In embodiments of the invention, hydrogen atoms may be ruptured from a molecule comprising hydrogen atoms and other non-hydrogen atoms, without removing a significant number of the non-hydrogen atoms from the molecule. For instance, in some embodiments, for every 2 hydrogen bonds that are broken by bombardment, one or less than one non-hydrogen bond is broken. In other embodiments, less than one non-hydrogen atom is removed per removal of 100 hydrogen atoms. In yet other embodiments, less than 50 non-hydrogen atoms are removed per removal of 100 hydrogen atoms (for every 2 hydrogen atoms removed by bombardment, one or less than one non-hydrogen atom is removed). In yet other embodiments, one or less than one non-hydrogen atom is removed per removal of 5 hydrogen atoms. In a polymer, for example, the non-hydrogen atoms that remain can be in the backbone of the polymer, in functional groups or in side groups. For instance, all carbon atoms in a carbon backbone may remain in the polymer after bombardment. Functional groups in the molecules such as halogen atoms can also remain attached to the carbon backbone after bombardment even though hydrogen atoms are removed.

After removing hydrogen atoms from the molecules on the substrate, the hydrogen-deficient and activated molecules may be further reacted or processed if desired. In some embodiments, heat or other reactants may or may not be applied to the hydrogen-deficient and activated molecules on the substrate to further process them. As noted above, in some embodiments, it may be desirable to cross-link the hydrogen-deficient and activated molecules on the substrate. In embodiments of the invention, cross-linking between hydrogen-deficient and activated molecules in a layer on a substrate can occur spontaneously (e.g., with or without the aid of heat or a specific cross-linking agent). Cross-linking the molecules can produce a dense and stable layer on the substrate. The resulting layer may have any suitable thickness (e.g., less than 100 nanometers). At the end of the cross-linking process, it may be desirable to expose the final product to molecular hydrogen so that residual radicals can be repaired by the addition of hydrogen.

Other specific embodiments of the invention are described in further detail below.

According to one specific embodiment, a thin film a few nanometers thick can be produced. The film is synthesized by depositing a controlled amount of hydrogen containing precursor molecules on a solid surface of a substrate. In this specific embodiment, the hydrogen precursor molecules can be, for example, simple alkanes (but could be different in other embodiments). Hydrogen atoms are ruptured from the molecules by bombarding the precursor molecules with hydrogen projectile particles. The hydrogen projectile particles have energies high enough to break hydrogen bonds, but not high enough to break other non-hydrogen bonds between non-hydrogen atoms (e.g., carbon, halogens, metals). As used herein, "hydrogen bonds" refer to bonds that are between atoms in which at least one is hydrogen. "Non-hydrogen bonds" refer to bonds between non-hydrogen atoms. In this embodiment, the hydrogen projectile particles can be ionized atoms or molecules of hydrogen or its isotopes, or could be energetic neutral atoms or molecules of hydrogen or its isotopes. The kinetic energies of the hydrogen projectile particles may be between about 5 and about 100 eV, preferably between about 10 and about 50 eV. After bombarding, the hydrogen deficient molecules are cross-linked to produce the thin film.

According to another embodiment, a film with a thickness larger than a few nanometer can be produced. The film is synthesized by depositing a controlled amount of hydrogen containing precursor molecules on a solid surface of a substrate. The hydrogen projectile particles have energies high enough to break hydrogen bonds, but not high enough to break other non-hydrogen bonds between non-hydrogen atoms. After bombardment, dangling bonds are formed. A dangling bond can move in the film from one atom site to another by the abstraction of one hydrogen atom to amend the dangling bond. The new dangling bond is moved to the atom site which loses the hydrogen. The movement of dangling bonds allows the cross-linking to occur at locations far away from the sites that are directly bombarded by the hydrogen particles. Polymer films with thicknesses larger than the penetration depth of the hydrogen particles can be prepared.

According to another embodiment, a film with a thickness larger than a few nanometers can be produced. The film is synthesized by depositing a controlled amount of hydrogen containing precursor molecules comprising unsaturated bonds on a solid surface of a substrate. The hydrogen projectile particles have energies high enough to break hydrogen bonds, but not high enough to break other non-hydrogen bonds between non-hydrogen atoms. After bombardment, dangling bonds are formed. A dangling bond can move in the film from one atom site to another by the abstraction of one pi electron of an adjacent unsaturated bond. The original dangling bond is amended by the formation of either a new pi bond or a new sigma bond. A new dangling bond is formed at the site of the original unsaturated bond. If the original dangling bond is amended by the formation of a new sigma bond, cross-linking and movement of dangling bond are accomplished in the same process. The movement of dangling bonds allows the cross-linking to occur at locations far away from the sites that directly bombarded by hydrogen particle. Polymer films with thicknesses larger than the penetration depth of the hydrogen particles can be prepared.

According to another specific embodiment, a hydrocarbon film a few nanometers thick is produced. It can have many chemical functional groups of the same kind. The hydrocarbon film is synthesized by depositing a controlled amount of hydrocarbon precursor molecules with the same kind of chemical functional groups on a solid surface. In this embodiment, the hydrocarbon precursor molecule can be, but is not limited to a simple alkane with the chemical functional groups on a carbon chain. The hydrogen atoms in the molecules are ruptured from the molecules by bombarding them with hydrogen projectile particles. The particles have energies that are high enough to break hydrogen bonds in the molecules, but that are not high enough to break other non-hydrogen bonds between non-hydrogen atoms. After removing hydrogen atoms, the molecules losing hydrogen atoms are cross-linked and a hydrocarbon film with the functional groups is produced.

According to yet another specific embodiment, a hydrocarbon film a few nanometers thick is produced. The film has many chemical functional groups of a specific combination. The hydrocarbon film is synthesized by depositing a controlled amount of hydrocarbon precursor molecules on a solid surface. Each precursor molecule has a specific combination of chemical functional groups (e.g., halogen and thiol groups). In this embodiment, each hydrocarbon precursor molecule can be, but is not limited to a simple alkane with the combination of chemical functional groups on a carbon chain. Hydrogen atoms are removed from the molecules by bombarding them with hydrogen projectile particles. The particles have energies high enough to break hydrogen bonds, but the energies are not high enough to break non-hydrogen bonds. After removing hydrogen atoms, the hydrogen-deficient and activated molecules are cross-linked and the hydrocarbon film with the combination of chemical functional groups in the precursor molecules is produced.

According to another specific embodiment, a film that is a few nanometers thick and that adheres tightly to a substrate can be produced. The film is synthesized by depositing a controlled amount of hydrogen containing precursor molecules on a solid surface of a substrate. The substrate surface may or may not have hydrogen atoms. In this embodiment, each hydrogen containing precursor molecule can be, but is not limited to a simple alkane. After depositing the precursor molecules, the molecules are bombarded with hydrogen projectile particles. The projectile particles have energies high enough to break hydrogen bonds, but are not high enough to break other non-hydrogen bonds. Hydrogen atoms are removed from the precursor molecules and active reaction sites are formed where the hydrogen atoms are removed. After removing hydrogen atoms, the hydrogen-deficient and activated molecules can cross-link with each other and can cross-link with the substrate surface. The resulting film can be chemically bonded to the substrate.

According to another specific embodiment, a solid substrate including a solid surface terminated by hydrogen atoms is provided. The surface is bombarded by hydrogen projectile particles. The substrate, as in the other embodiments, can comprise at least one of a metal, semiconductor, insulator or polymer. The kinetic energies of the particles are high enough to break hydrogen bonds, but are generally not high enough to break non-hydrogen bonds. The hydrogen projectile particles can be ionized atoms or molecules of hydrogen or its isotopes, and can be energetic neutral atoms or molecules of hydrogen or its isotopes. The kinetic energies of the hydrogen projectile particles may be between about 5 and about 100 eV, preferably between about 10 and about 50 eV. Active reaction sites (e.g., comprising dangling bonds) are formed by the loss of hydrogen. These active reaction sites then form chemical bonds with a specific dose of adsorbates. The adsorbates can be deposited by spin-coating, jet-printing, screen-printing, evaporation, or other common deposition methods prior to the surface activation, or by jet-printing and vacuum dosing subsequent to the surface activation. In this embodiment, the fixation of the adsorbates on the surface produces a novel material having a surface with predetermined properties. In yet other embodiments, a second solid substrate can be laminated onto the first substrate with the active reaction sites. The second solid substrate can be bound to the first substrate through the active reaction sites.

This embodiment illustrates that embodiments of the invention are not limited to bombarding molecules that have been previously deposited on a substrate. As shown in this embodiment, embodiments of the invention can be used as to modify the properties of the surface of a substrate. Additional substances may then be deposited on the surface-modified substrate. These additional substances (e.g., polymeric substances) may, for example, bind to the areas of the substrate surface that are modified. The substances and the substrate may be bound together through, for example, chemical bonds such as covalent bonds. For example, a flexible polymeric film (e.g., a polyethylene sheet) can be bombarded with hydrogen projectile particles to selectively remove hydrogen atoms and form active reaction sites where those hydrogen atoms are removed. An additional substance can then be deposited on the substrate and can be coupled to the active reaction sites. Chemical bonds may form between the additional substance and the substrate at the active reaction sites.

In another embodiment of the invention, a hydrocarbon film (e.g., about 5 nanometer thick or less) dense enough to protect a silicon surface from oxidation can be produced. A simple alkane like dotriacontane, $CH_3(CH_2)_{30}CH_3$, is spin coated onto a bare and clean silicon wafer. The adsorbed hydrocarbon molecules are activated by $H^+$ in the energy range of 5-100 eV, preferably at about 10-50 eV by selectively breaking C—H bonds. The activated molecules cross-link and form a 5 nanometer thick hydrocarbon film dense enough to protect the silicon wafer surface from air oxidation.

In another embodiment, a dense hydrocarbon film (e.g., about 5 nanometers or less) with a high concentration of carboxylic acid groups and no other chemical functional groups is produced. An alkane with a carboxyl group on the carbon chain, such as docosanoic acid ($CH_3(CH_2)_{20}COOH$), is spin coated onto a bare and clean silicon wafer. The adsorbed hydrocarbon molecules are activated after being bombarded using $H^+$ projectile particles in the energy range of about 5 to about 100 eV (preferably at about 10 eV). C—H bonds are selectively broken by the $H^+$ projectile particles. The activated molecules cross-link and form a 5 nanometer thick dense hydrocarbon film with a high concentration of carboxylic acid groups, but without other chemical functionalities.

Additional examples of embodiments of the invention are provided below. In the examples, $H^+$ projectile ions were produced and extracted from a $H_2$ plasma in a hot DC filament Colutron ion source. After mass and energy selection, $H^+$ ions with the desirable kinetic energies were impinged at normal incidence to the sample. Bombardment energies in the range of about 5 to about 100 eV were used and the ion fluence was above about $1 \times 10^{15}$ ions/cm$^2$ which is about half of an atomic monolayer. The energy spread of the ion beam was estimated to be ~0.5 eV at a beam energy of 10 eV. The pressure of the sample chamber during ion bombardment was $2 \times 10^{-8}$ Torr, with the main residual gas being hydrogen. Surface contamination was minimal.

The results of the bombardment process were analyzed using an X-ray photoelectron spectrometer (XPS) having a Kratos ASIS-HS electron analyzer with a monochromatic Al K$\alpha$ X-ray source. The XPS chamber and a LEIB system ("low energy ion beam system" of the type described in W. M. Lau et al., Nuclear and Instrumental Methods B 59/60 (1991)316-320) were linked together by ultrahigh vacuum connections (<$1 \times 10^{-8}$ Torr) so that samples could be analyzed, transferred and bombarded without any exposure to air. Ex-situ atomic force microscopy (AFM) measurements were performed using a Nanoscope III AFM system. The synthetic results from the LEIB system and the characterization results from the XPS and AFM systems confirmed (experimentally) the principle of the invention, which is elaborated in the sections above and below.

EXAMPLE 1

Dotriacontane, $CH_3(CH_2)_{30}CH_3$, was selected to test for selective bond breaking using 10 eV $H^+$ ions as projectile particles in a bombardment process. This molecule is large enough so that it does not desorb in vacuum even without cooling. It can be coated uniformly by spin coating on a substrate such as a silicon wafer. In addition, dotriacontane has a linear molecular structure and contains only saturated C—C and C—H bonds, which eases the determination of any structural changes in the synthetic process.

The substrate, a Si (100) wafer, was pre-treated with ultrasonic cleaning in a methanol bath followed by a 1.1 M HF solution dip for removing organic contamination and surface oxides. Hyperthermal ion bombardment of the dotriacontane film with $H^+$ in the energy range of 5-100 eV was carried out in a mass-and-energy-selective low energy ion beam (LEIB) system. The surface was characterized using an XPS system having a Kratos ASIS-HS spectrometer equipped with a monochromatic Al K$\alpha$. The XPS chamber and LEIB system were linked together by ultrahigh vacuum connections (<$1 \times 10^{-8}$ Torr) so that samples were analyzed, transferred and bombarded without exposure to air. Ex-situ AFM measurements were performed using a Nanoscope III AFM system.

With the proposed selectivity in bond breakage, one expects to observe cross-linkage and the generation of secondary carbons which were not present in the molecular film prior to ion bombardment. In the literature, the present inventors found that while the valence band (VB) XPS of polyethylene and polypropylene (G. Beamson and D. Briggs, "High resolution XPS of Organic Polymers, The Scienta ESCA 300 Database", Wiley, England, 1992.) both have two spectral bands at 14 and 19 eV, an additional band at 17 eV is evident in polypropylene and assigned as spectral characteristics of secondary carbons (R. M. France and R. D. Short, Langmuir 14, (1998)4827-4835.) When VB XPS was applied to the virgin $C_{32}H_{66}$ film and the ion bombarded film, the present inventors found that the virgin film gave the two expected bands at 14 and 19 eV, and the treatment by 10 eV $H^+$ led to the generation of an additional spectral band at ~17 eV and thus secondary carbon formation. Cross-linking of the precursor molecules was confirmed. From the XPS probing depth, the thickness of the cross-linked molecular film was found to be about 5 nanometers.

The silicon below the film was checked to see if the carbon radicals produced by the $H^+$ bombardment process reacted with the silicon. No silicon carbide was formed after bombardment with 10 eV $H^+$. The result showed that cross-linkage and recombination of the carbon radicals occurred, but no carbon-silicon bonds were formed. The complete recombination of the carbon radicals by cross-linking was further confirmed by our observation that dosing the treated film with $H_2O$, $O_2$ or $CH_2=CH—COOH$ to over $10^4$ Langmuirs at room temperature did not induce any chemisorption of these species.

The virgin dotriacontane film could be dissolved in ethanol and hexane because the molecules in a virgin dotriacontane film did not cross-link. When the virgin film was bombarded with $H^+$ particles at about 5 eV, the bombardment process did not rupture hydrogen from dotriacontane since the energy was low. Hence, carbon radicals did not form and the dotriacontane molecules did not cross-link. Most of the bombarded dotriacontane could still be dissolved by ethanol and hexane. When the virgin film was bombarded with $H^+$ particles at about 100 eV, the energy was high enough to rupture carbon atoms from dotriacontane. Desorption and sputtering of the residual fragments removed most of the hydrocarbon species on the substrate.

However, when the virgin film was bombarded with $H^+$ particles at about 10 to about 50 eV, hydrogen atoms from the virgin dotriacontane were removed, but carbon atoms were not removed. The bombarded dotriacontane molecules cross-linked and a dense and stable film was formed. The formed film could not be dissolved or removed using ethanol and hexane.

The films that were prepared were further analyzed with a contact mode AFM. When AFM measurements were performed on a virgin $C_{32}H_{66}$ film, contact mode AFM could easily tear the film and create holes on it due to the displacement of the molecules by the AFM tip. The case was different after the dotriacontane film had been treated by 10 eV $H^+$. The AFM revealed a coherent film without any detectable pinholes. The same image could be obtained by repeating the scan on the same region and with different scanning angles, which supports the formation of a rigid and physically stable two-dimensional molecular network. Furthermore, when the virgin dotriacontane film was exposed in air, XPS showed that the silicon under the film gradually oxidized. This indicates that the virgin dotriacontane did not form a film dense enough to prevent the penetration of oxygen and water molecules through the film. However, after the virgin dotriacontane was treated using 10 eV H$^+$, the cross-linked film thus produced could protect the substrate silicon from air oxidation after prolonged air exposure.

The number of H$^+$ particles needed to produce a cross-linked film of a certain thickness was also investigated. It was found that about 20-30 H$^+$ ions at 10 eV can cross link one dotriacontane so that the resultant molecular network (which includes the dotriacontane) does not dissolve in ethanol and hexane. The resultant film protects the silicon substrate from oxidation after prolonged exposure to air.

Similar results were obtained when dotriacontane was coated on silicon dioxide and copper surfaces.

EXAMPLE 2

Docosanoic acid, $CH_3(CH_2)_{20}COOH$, was used instead of dotriacontane. Docosanoic acid molecules were spin-cast onto a cleaned silicon wafer. The ion beam treatment conditions and characterization methods are similar to EXAMPLE 1. XPS showed that the virgin docosanoic acid molecules were removed by dissolution in hexane, and that H$^+$ bombardment at 10 eV caused cross-linkage of docosanoic acid molecules without breaking other bonds in the molecules. The resulting film could not be dissolved in hexane. Repeated AFM imaging showed that the film was coherent and mechanically strong. When a sample without the hydrogen bombardment treatment was exposed to air for 15 days, XPS showed that the Si surface was oxidized while another sample with the ion beam treatment showed no Si oxidation.

EXAMPLE 3

Docosanoic acid, $CH_3(CH_2)_{20}COOH$, was spin-coated on polyethylene. The ion beam treatment conditions and characterization methods are similar to EXAMPLE 1, except that a source of low energy electrons was used to neutralize any excessive surface charge during ion bombardment. XPS confirmed that carboxylic acid functional groups were anchored to the polymer surface.

In the present description, example embodiments are given with reference to specific configurations and techniques. One of ordinary skill in the art would appreciate that other embodiments having other configurations and method steps are possible. For example, any conventional production technique can be used to produce the composition of the coating(s), so long as the technique is competent to produce the desired composition. For example, the relative concentrations of the materials in the coatings, of course, may be varied, and impurities may be tolerated, so long as the resulting formulations are still competent to produce desired characteristics. Other embodiments having other configurations or techniques are all within the scope of this invention, given the knowledge provided by the present description to one of ordinary skill in the art. Moreover, features of one or more embodiments of the invention may be combined in any suitable manner without departing from the scope of the present invention.

What is claimed is:

1. A method comprising:
    (a) depositing hydrocarbon molecules comprising hydrogen atoms and other atoms on a substrate to form a hydrocarbon layer;
    (b) bombarding the deposited molecules with a beam of only ionized hydrogen projectile particles which have kinetic energies between about 5 eV and about 100 eV; and
    (c) preferentially breaking C—H bonds in the molecules in the hydrocarbon layer by collision induced breakage of the C—H bonds using the hydrogen projectile particles without removing a significant number of the other atoms from the molecule.

2. The method of claim 1 wherein in (a), the deposited molecules are adsorbed on the surface of the substrate.

3. The method of claim 1 wherein (a) comprises adsorbing molecules comprising hydrogen atoms to form the hydrocarbon layer, wherein the hydrocarbon layer has a thickness which ranges from an atomic monolayer to about 100 nanometers.

4. The method of claim 1 wherein depositing comprises spin-coating, jet-printing, screen-printing, or evaporation.

5. The method of claim 1 wherein the beam of ionized hydrogen projectile particles are extracted from a plasma generated using an electron cyclotron resonance plasma reactor or other plasma reactors.

6. The method of claim 1 wherein the molecules comprise saturated or unsaturated hydrocarbons.

7. The method of claim 1 wherein the deposited molecules comprise saturated or unsaturated hydrocarbon molecules with chemical functional groups.

8. The method of claim 1 wherein the substrate comprises one of a metal, and a semiconductor.

9. The method of claim 1 wherein (c) comprises removing hydrogen atoms to form hydrogen-deficient and activated molecules, and wherein the method further comprises moving the active reaction sites of the hydrogen-deficient and activated molecules intermolecularly or intramolecularly.

10. The method of claim 1 wherein (c) comprises removing hydrogen atoms to form hydrogen-deficient and activated molecules, and wherein the method further comprises cross-linking the hydrogen-deficient and activated molecules on the substrate.

11. The method of claim 1 wherein (c) comprises removing hydrogen atoms to form hydrogen-deficient and activated molecules, and wherein the method further comprises cross-linking the hydrogen-deficient and activated molecules to the atoms of the substrate.

12. The method of claim 1 wherein the hydrocarbon molecules are alkanes.

13. The method of claim 12 wherein the beam of ionized hydrogen projectile particles are generated using an electron cyclotron resonance plasma reactor.

14. The method of claim 13 wherein the hydrocarbon layer is deposited using chemical vapor deposition.

15. The method of claim 14 wherein the substrate is in the form of a curved body.

16. A method comprising:
    a) providing a substrate and a hydrocarbon layer on a surface of the substrate;
    b) bombarding the hydrocarbon layer with a beam of only ionized hydrogen projectile particles which have kinetic energies between about 5 eV and 100 eV;
    c) preferentially breaking C—H bonds in the molecules in the hydrocarbon layer collision induced breakage of the C—H bonds using the hydrogen projectile particles to form active reaction sites without removing a significant number of the other atoms from the molecule; and d) depositing a substance on the hydrocarbon layer and anchoring the substance to the hydrocarbon layer through the active reaction sites.

17. The method of claim 16 wherein the substrate comprises one of a metal, and a semiconductor.

18. The method of claim 16 wherein in step d), the substance comprises a mixture of atoms or molecules to be anchored to the active reaction sites on the bombarded hydrocarbon layer to form a surface with predetermined properties.

19. The method of claim 16 wherein in (d), the substance comprises another solid substrate to be anchored to the active reaction sites on the bombarded hydrocarbon layer to form a product with predetermined properties.

20. The method of claim 16 wherein depositing comprises evaporation, spin-coating, jet-printing, screen-printing, or mechanical rolling.

21. The method of claim 16 wherein the beam of ionized hydrogen particles are extracted from a plasma generated using an electron cyclotron resonance plasma reactor or other plasma reactors.

22. The method of claim 16 wherein the active reaction sites comprise dangling bonds.

* * * * *